(12) United States Patent
Weng et al.

(10) Patent No.: US 8,853,048 B2
(45) Date of Patent: Oct. 7, 2014

(54) STREAMLINED PROCESS FOR VERTICAL SEMICONDUCTOR DEVICES

(71) Applicant: Taiwan Semiconductor Manufacturing Co., Ltd., Hsin-Chu (TW)

(72) Inventors: Wu-An Weng, Hsinchu (TW); Chen-Chien Chang, Yuli Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/666,193

(22) Filed: Nov. 1, 2012

(65) Prior Publication Data

US 2014/0120690 A1 May 1, 2014

(51) Int. Cl.
*H01L 21/8242* (2006.01)
*H01L 21/20* (2006.01)
*H01L 49/02* (2006.01)
*H01L 27/108* (2006.01)
*H01L 29/94* (2006.01)

(52) U.S. Cl.
CPC ..................................... *H01L 28/60* (2013.01)
USPC ........... 438/386; 438/243; 438/387; 438/244; 257/E29.346; 257/E27.092; 257/301

(58) Field of Classification Search
USPC ......... 438/243–249, 386–392, 239, 689–693, 438/700, 589
See application file for complete search history.

(56) References Cited

U.S. PATENT DOCUMENTS

| | | | | |
|---|---|---|---|---|
| 5,204,280 | A * | 4/1993 | Dhong et al. | 438/386 |
| 5,963,841 | A * | 10/1999 | Karlsson et al. | 438/585 |
| 2002/0008267 | A1* | 1/2002 | Weijand et al. | 257/301 |
| 2005/0164469 | A1* | 7/2005 | Haupt | 438/434 |
| 2007/0015327 | A1* | 1/2007 | Su | 438/244 |

* cited by examiner

*Primary Examiner* — Mary Wilczewski
*Assistant Examiner* — Erik T Peterson
(74) *Attorney, Agent, or Firm* — Eschweiler & Associates, LLC

(57) ABSTRACT

The present disclosure provides a streamlined approach to forming vertically structured devices such as deep trench capacitors. Trenches and a contact plate bridging the trenches are formed using one lithographic process. A hard mask is formed over the substrate and etched through the mask to form two or more closely spaced trenches. The hard mask is then reduced by an isotropic etch process. The etch removes the hard mask preferentially between the trenches. Chemical mechanical polishing removes the conductive material down to the remaining hard mask layer, whereby conductive material remains in mask openings and forms a conductive bridge across the trenches.

19 Claims, 7 Drawing Sheets

STREAMLINED PROCESS FOR VERTICAL SEMICONDUCTOR DEVICES

FIELD

The present disclosure relates to integrated circuits and semiconductor device fabrication. In particular, the disclosure relates to a process of forming a vertically structured device such as a deep trench capacitor.

BACKGROUND

The semiconductor industry has long been interested in vertical device structures. Vertical device structures can greatly reduce the surface area requirement for a semiconductor device. Deep trench capacitors are one type of vertical device that has received attention. Deep trench capacitors can be used in various capacities, most notably in forming dynamic random access memory (DRAM).

Semiconductor devices fabrication requires a very large number of process operations and process controls. The number of steps and their complexity contributes significantly to manufacturing cost. Accordingly, there has been a long felt need for new semiconductor device manufacturing processes that require fewer steps and less queue time, that are easier to control and are more reliable, or both.

DETAILED DESCRIPTION

Figure 1:
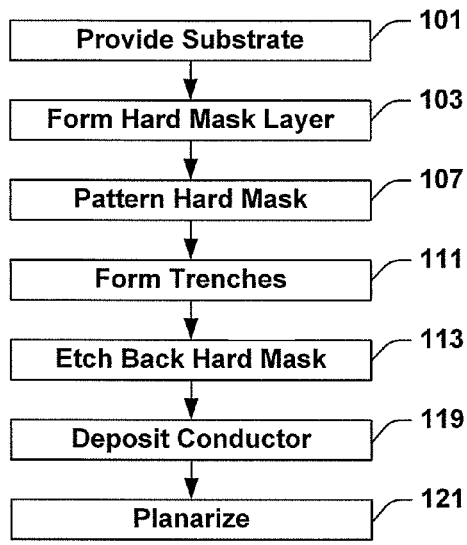
FIG. 1 provides an exemplary process of the present disclosure according to one or more embodiments.
Figure 2:
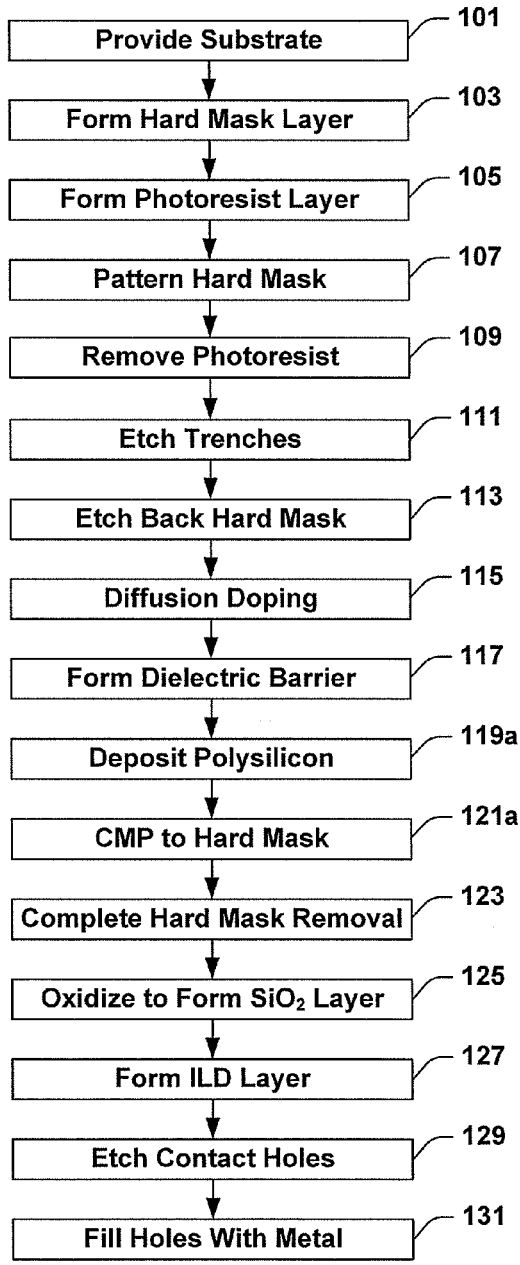
FIG. 2 provides an example of a process of FIG. 1 according to one or more embodiments.
Figure 3:
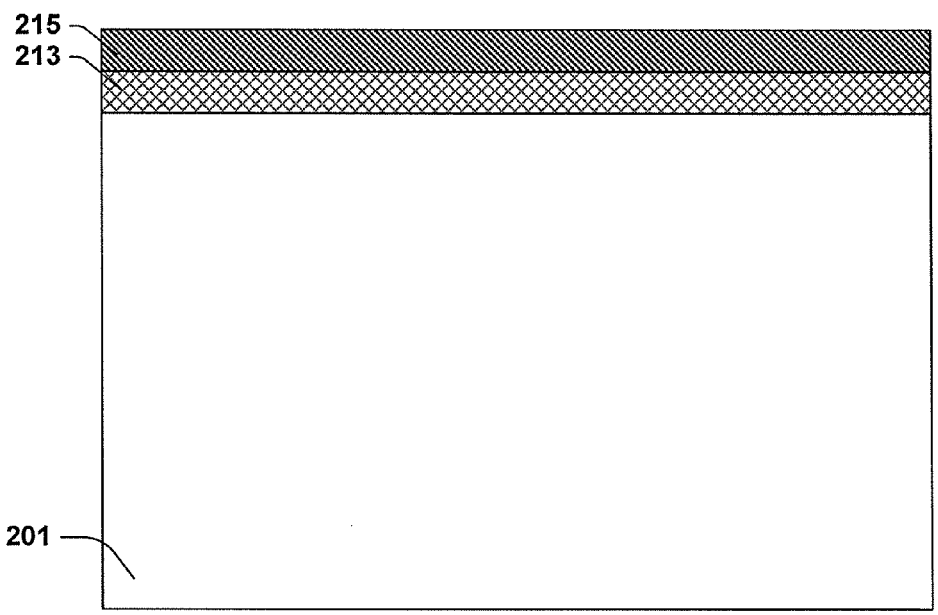
FIG. 3 illustrates an exemplary substrate with hard mask and resist layers formed thereon according to one or more embodiments.

FIG. 1 is flow chart of a process 100 according to one or more embodiments of the present disclosure. FIG. 2 is a flow chart of a process 150 according to one or more embodiments, which is an example of the process 100 with additional details applicable to forming a deep trench capacitor. FIGS. 3 through 14 illustrate a substrate 200 as it progresses through the process 150 according to one or more embodiments.

Operation 101 is providing a semiconductor substrate 200. The substrate 200 includes a semiconductor 201 and is a semiconductor device at an intermediate stage of manufacture. Examples of semiconductors include, without limitation, silicon, silicon on insulator (SOI), Ge, SiC, GaAs, GaAlAs, InP, GaN, and SiGe. The process 100 forms closely spaced parallel trenches 209 in the semiconductor 201, fills the trenches 209 with conductor 207, and also forms a conductive bridge 224, which can be a contact plate, across the trenches 209. The semiconductor 201 can include regions, structures, and devices that are not illustrated by the Figures and are formed by one or more operations that can take place before, overlapping with, or after the operations of the process 100.

Operation 103 is forming a hard mask layer 213 over the substrate 200. Hard mask layer 213 can include one or more layers. Any suitable material or combination of materials can be used. A typical hard mask material is silicon dioxide. Examples of other materials that may be suitable for the hard mask layer 213 include without limitation, silicon nitride and SiON. The hard mask layer 213 can be formed by any suitable process or combination of processes. Operation 105 in FIG. 2 is forming a photoresist layer 215 over the hard mask layer 213 to provide a structure such as the one illustrated by FIG. 3 according to one or more embodiments.

Figure 4:
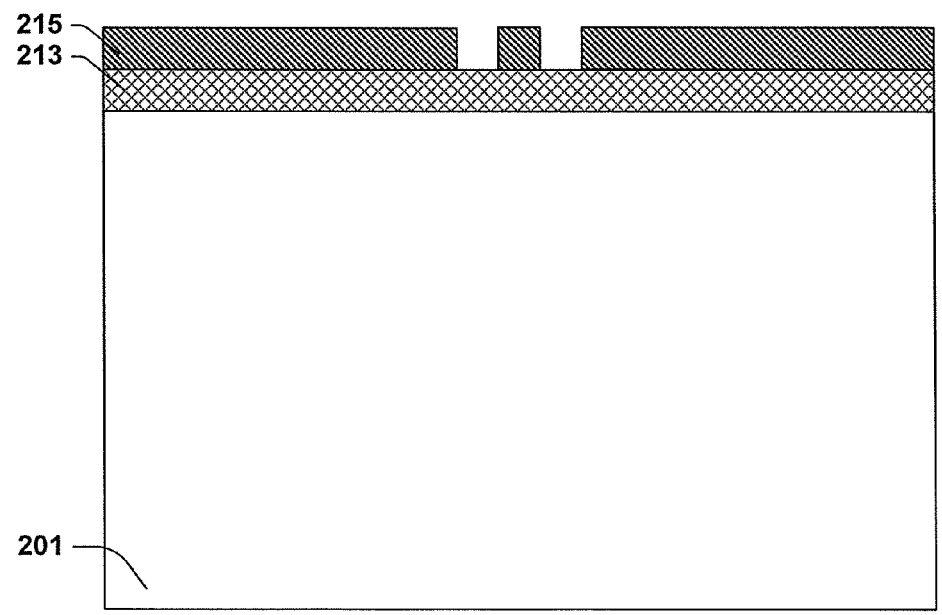
FIG. 4 illustrates the structure of FIG. 3 following patterning of the resist layer according to one or more embodiments.
Figure 5:
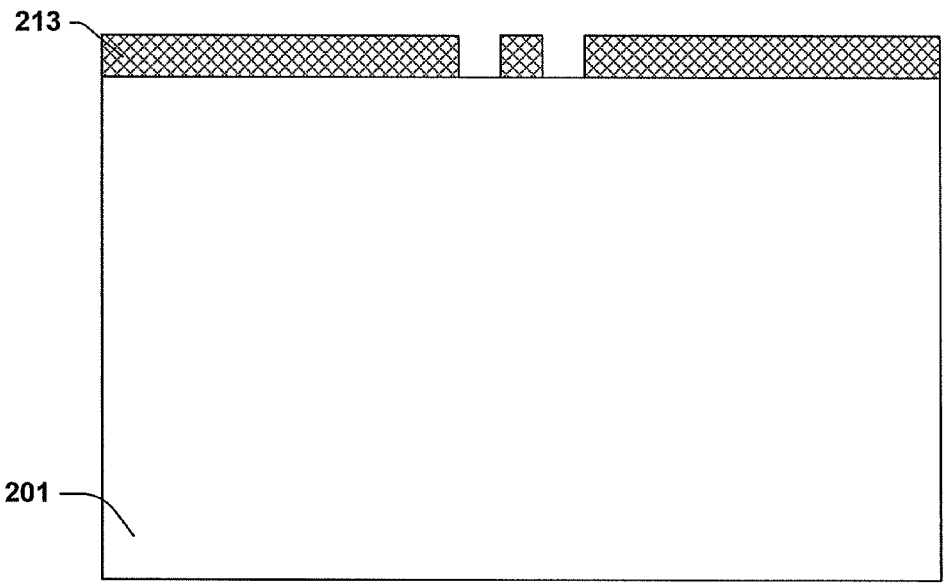
FIG. 5 illustrates the structure of FIG. 4 following patterning of the hard mask layer and removal of the resist layer according to one or more embodiments.

Operation 107 is patterning the hard mask layer 213. Patterning forms openings in the hard mask layer 213 where trenches 209 are desired. Patterning can be accomplished by any suitable process. A suitable process typically includes photolithography. The photoresist 215 is selectively exposed according to the desired pattern and developed to provide a structure as illustrated by FIG. 4 according to one or more embodiments. The patterned photoresist 215 is then used as a mask to etch the hard mask layer 213 and transfer the trench pattern from the photoresist 215 to the hard mask layer 213. The photoresist can then be stripped (operation 109 in FIG. 2) to provide the structure illustrated by FIG. 5 according to one or more embodiments.

Figure 6:
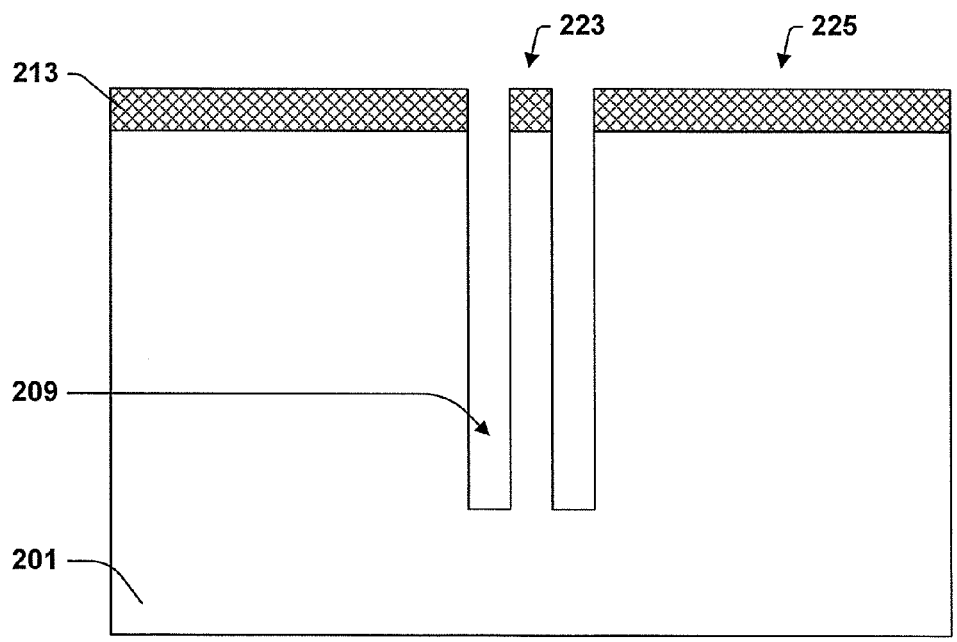
FIG. 6 illustrates the structure of FIG. 5 following etching to form trenches according to one or more embodiments.

Operation 111 is forming trenches 209 by etching the semiconductor 201 using the patterned hard mask layer 213 as a mask. FIG. 6 illustrates the resulting structure according to one or more embodiments. Any suitable etch process can be used. A suitable etch process is typically a plasma etch. Trenches 209 can have a high aspect ratio. A high aspect ratio is a depth to width ratio of 10:1 or more in one embodiment. When process 100 is applied to form structures for deep trench capacitors or similar devices, aspect ratios may vary from 20:1 to 50:1 in one embodiment. Typical depths may vary from 500 nm to 10,000 nm in one embodiment. The widths of trenches 209 may vary from about 28 nm to 500 nm in one embodiment. Widths may vary from 50 nm to 200 nm in another embodiment.

Trenches 209 can comprise a large number of evenly spaced parallel trenches. A large number can be a number greater than 10 in one embodiment or greater than 100 in another embodiment. Adjacent pairs of trenches 209 are considered parallel if the distance between trenches remains approximately constant over a length/depth of the trenches that is one or more orders of magnitude greater than the trench widths. Parallelism and adjacency occur over a region of the substrate 200 that can be limited. Accordingly, parallel and adjacent trenches 209 can vary in their lengths and can have structures that vary at their ends outside the region of parallelism.

Figure 7:
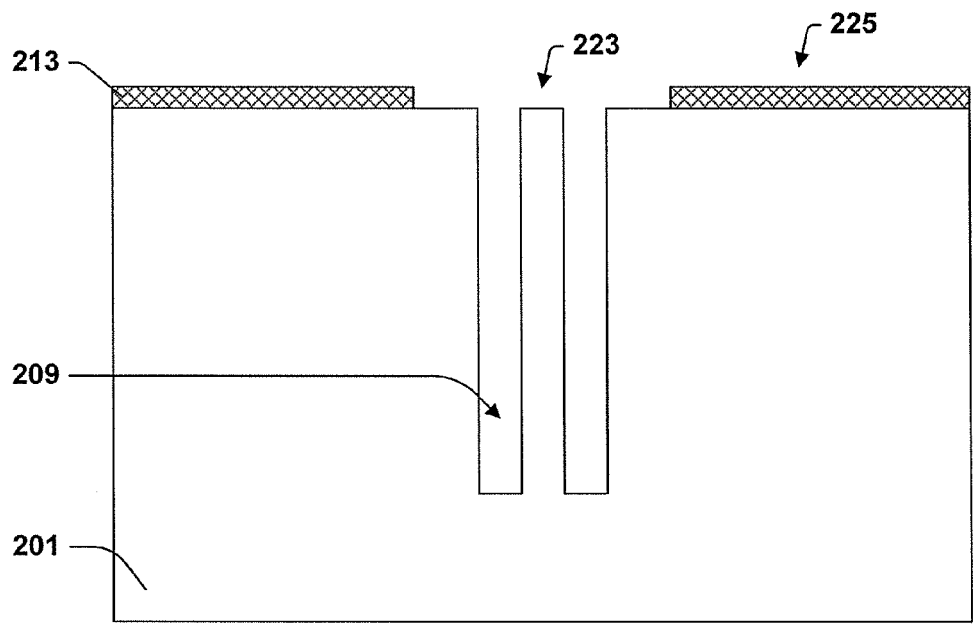
FIG. 7 illustrates the structure of FIG. 6 after etching back the hard mask according to one or more embodiments.

Operation 113 is an etch back process that partially removes the hard mask 213, as illustrated in FIG. 7 according to one or more embodiments. The etch back process removes the hard mask layer 213 from locations 223, which are locations between adjacent trenches 209, to a greater extent than from location 225, which are away from trenches 209. In particular, operation 113 causes the surface of the hard mask layer 213 to retreat at location 223 to a greater extent than at locations 225. Operation 113 reduces the hard mask layer 213 thickness at locations 215 to half or less than its original thickness. Operation 113 can remove the hard mask layer 213 completely from locations 223 while leaving the hard mask layer 213 as a coating over locations 225. By removing the hard mask layer 213 from some locations 223, openings in the resultant hard mask layer 213 corresponding to trenches 209 can become united by operation 213, thereby changing the pattern of the hard mask layer 213 and reducing the number of openings through that layer. FIG. 7 illustrates a structure resulting from operation 113 according to one or more embodiments.

Preferential etching at location 223 can be achieved by using a lateral or isotropic etch process that takes advantage of the greater ratio of exposed surface to volume of the hard mask layer 213 at locations 223 as compared to the hard mask layer 213 at locations 225. A typical process for operation 113 is a wet etch. The surface to volume ratio of the hard mask layer 213 at locations 223 relates to the thickness of the hard mask layer 213 in comparison to the spacing of the trenches 209. Preferential etching at location 223 is enhanced when the trenches 209 are closely spaced. The spacing is typically in the range from 30 nm to 200 nm, and is generally less than 100 nm. The thickness of the hard mask layer 213 prior to operation 113, is generally greater than or equal to half the spacing of trenches 209, for example, 100 nm, in one embodiment. Typically, the thickness is greater than or equal to the spacing of trench 209, and can be 2 or more times greater to facilitate selective removal of the hard mask layer 213 from locations 223.

Figure 8:
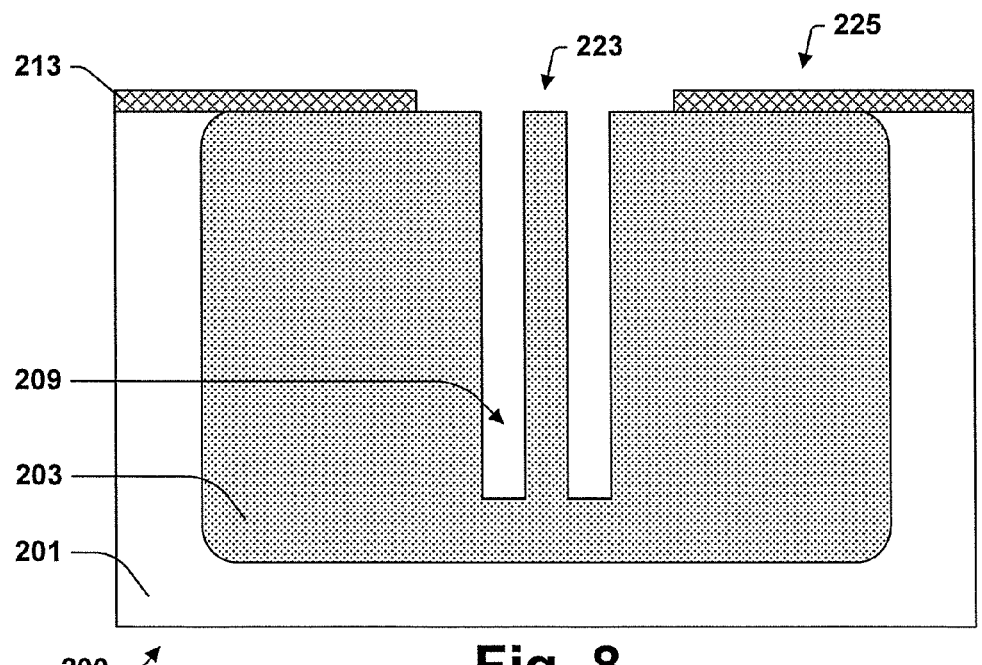
FIG. 8 illustrates the structure of FIG. 7 after diffusion doping according to one or more embodiments.

Operation 115 in FIG. 2 is doping the semiconductor 201 in the vicinity of trenches 209 to form a conductive well 203, as illustrated in FIG. 8 according to one or more embodiments. The doping can be n-type or p-type. Any suitable doping process can be used. A typical doping process for operation 115 is a diffusion doping process. For example, the semiconductor 201 can be doped with phosphorous by exposing the heated substrate 201 to $POCl_3$ vapor. As shown the conductive well 203 extends to a depth greater than that of the trenches 209. To the extent that the trenches have a depth that may vary in one embodiment between 500 nm and 10,000 nm, the conductive well 203 has a depth greater than between 500 nm and 10,000 nm, respectively, in one embodiment. A width of the conductive well 203 will be dictated by the number of desired trenches, as may be appreciated.

Figure 9:
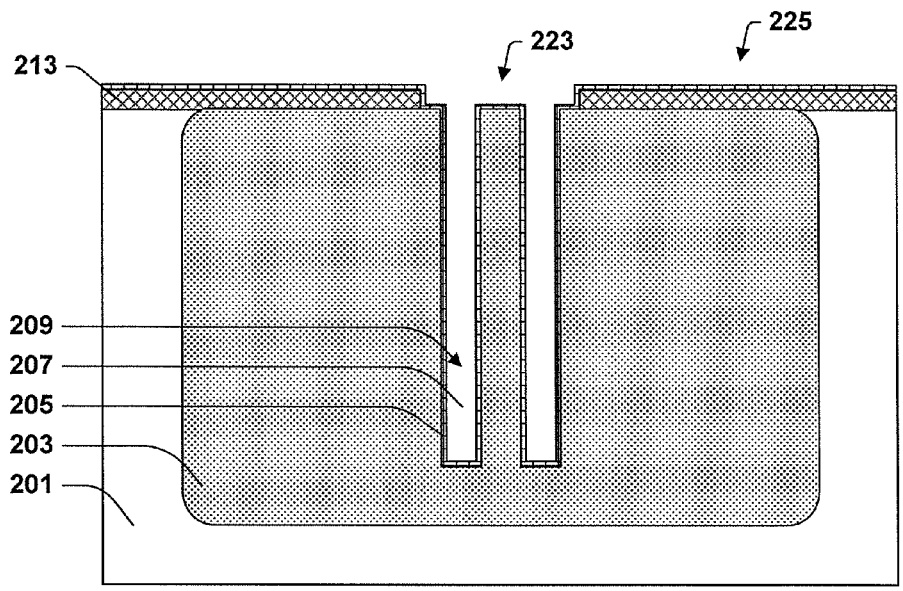
FIG. 9 illustrates the structure of FIG. 8 following formation of a dielectric barrier according to one or more embodiments.

Operation 117 in FIG. 2 lines trenches 209 with a dielectric barrier 205, as illustrated in FIG. 9 according to one or more embodiments. The barrier 205 can be formed from one or more layers of any suitable dielectric(s). A typical structure for the barrier 205 includes two or more layers. Typical materials for these layers include $SiO_2$, SiON, and SiN, and each of such layers may have a thickness of between 5 nm to 10 nm, in one embodiment. Other examples of material that can be used for the dielectric barrier 205 include, without limitation, $Ta_2O$, $Al_2O_3$, and high-k dielectrics. The dielectric barrier 205 can be formed by any suitable process or combination of processes. An initial operation can be deglazing to remove oxides formed on the sidewalls of the trenches 209 during prior processing.

Figure 10:
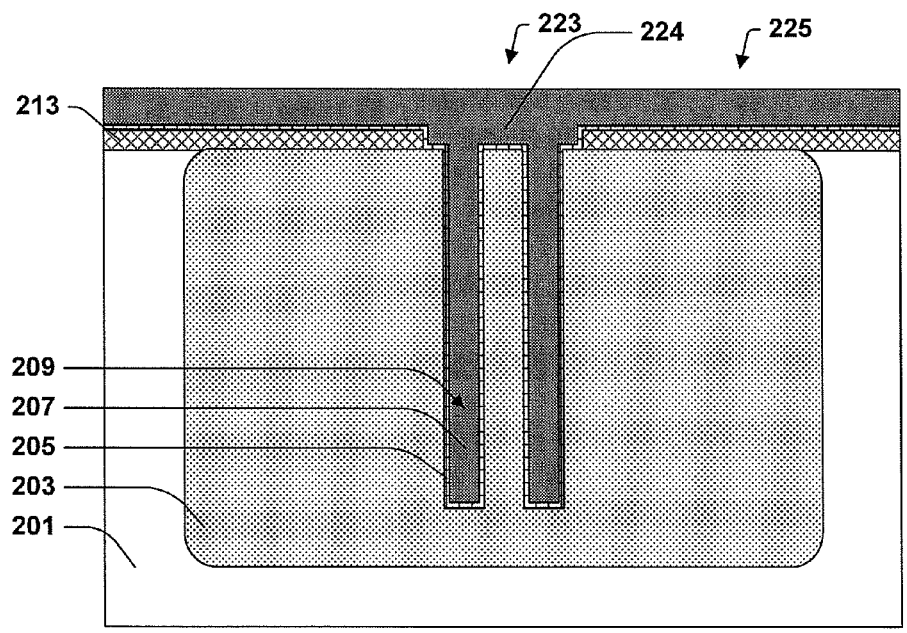
FIG. 10 illustrates the structure of FIG. 9 following deposition of conductive material according to one or more embodiments.

Operation 119 of FIG. 1 is depositing conductive material. The conductive material fills the trenches 209. The conductive material fills openings in the hard mask layer 213, recesses in the hard mask layer 213 at location 223 where the hard mask layer 213 has not been completely removed, and overlays the hard mask layer 213 at locations 225. Operation 119 forms contact plates 224 in recesses or openings in the hard mask layer 213 as shown in FIG. 10 according to one or more embodiments. Operation 119a of process 150 in FIG. 2 is an example of operation 119 in which the conductive material includes polysilicon (polycrystalline silicon). In general, operation 119 can employ any suitable conductive material or combination of materials. Operation 119 can form multiple layers of various conductive materials. Examples of conductive materials that can be used include doped semiconductors, metals, and metallic compounds. Examples of metals that can be used in operation 119 include, without limitation, tungsten, titanium, tantalum, ruthenium, cobalt, copper, aluminum, lead, platinum, tin, silver, and gold. Examples of metallic compounds that can be used in operation 119 include, without limitation, tantalum nitride, titanium nitride, tungsten silicide, tungsten nitride, titanium nitride, tantalum nitride, ruthenium oxide, cobalt silicide, and nickel silicide. The conductive material can be deposited by any suitable process or combination of processes.

Figure 11:
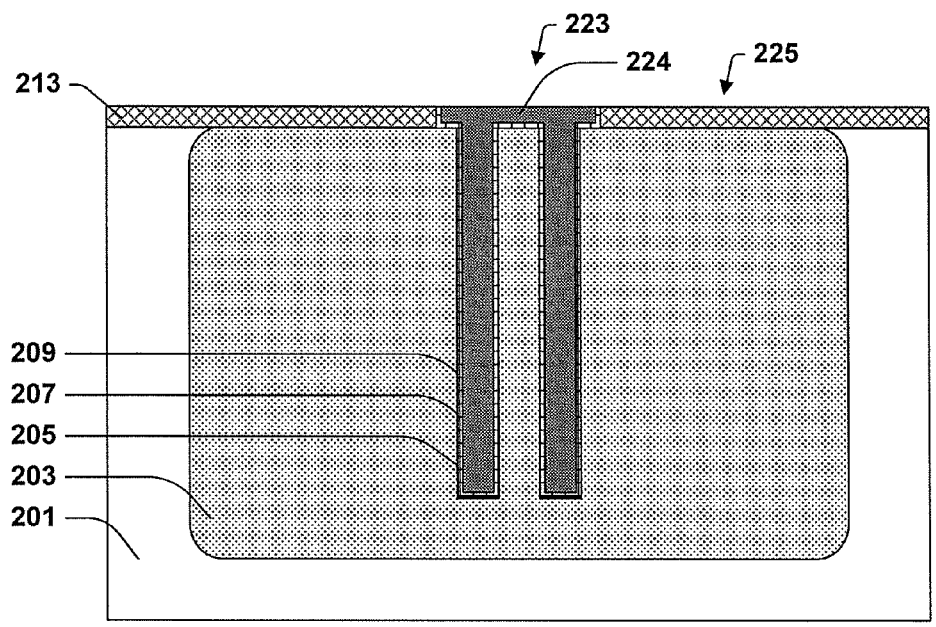
FIG. 11 illustrates the structure of FIG. 10 following planarization according to one or more embodiments.

Operation 121 of FIG. 1 planarizes the surface of the substrate 200 to remove conductive material from region 225 while leaving conductive material in region 223 to form contact plate 224. FIG. 11 illustrates the substrate 200 after operation 121. Contact plate 224 can abut the surface of the semiconductor 201 as shown in FIG. 11 according to one or more embodiments. Alternatively, the contact plate 224 can be separated from the semiconductor 201 by a thinned remaining portion of the hard mask layer 213. While any suitable planarization process can be used, operation 121 is generally operation 121a of FIG. 2, which is chemical mechanical polishing. The portion of the hard mask layer 213 left by operation 113 can provide a stop layer for the planarization process, especially chemical mechanical polishing. In the above embodiment, the resultant thickness of the contact plate 224 is about that of the hard mask layer 213, for example, about 100 nm in one embodiment.

Figure 12:
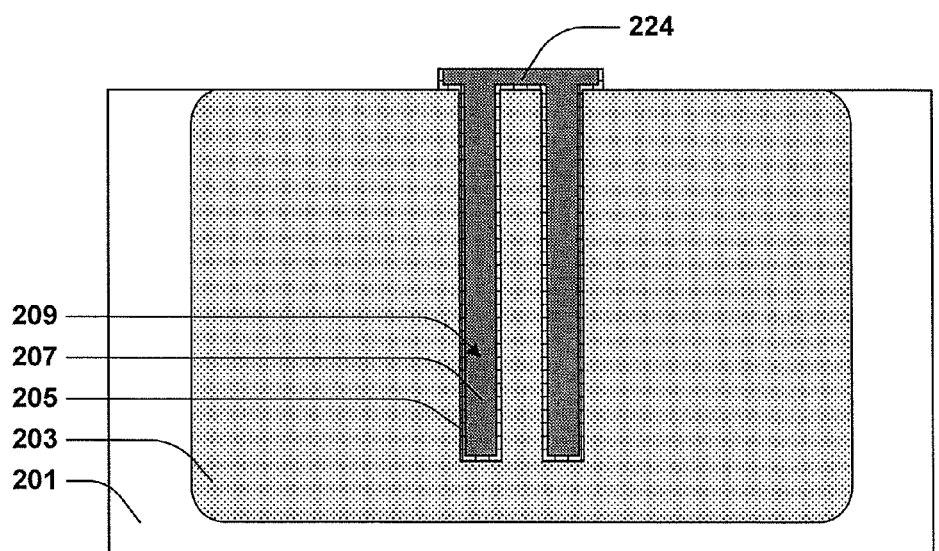
FIG. 12 illustrates the structure of FIG. 11 following removal of the remaining portion of the hard mask layer according to one or more embodiments.

Operation 121 of the process 100 is generally followed by additional processing. Process 150 of FIG. 2 shows some additional operations that may be applied. After operation 121, the hard mask layer 213 has generally served its purpose. In process 150, operation 121 is followed by operation 123, removing the remaining portion of the hard mask layer 213. Completing removal of the hard mask layer 213 leaves contact plates 224 protruding from the surface of the substrate 200 as illustrated by FIG. 12 according to one or more embodiments. The hard mask layer 213 can be removed by any suitable process or combination of processes. A typical process is a wet process that oxidizes the material of the hard mask layer 213.

Figure 13:
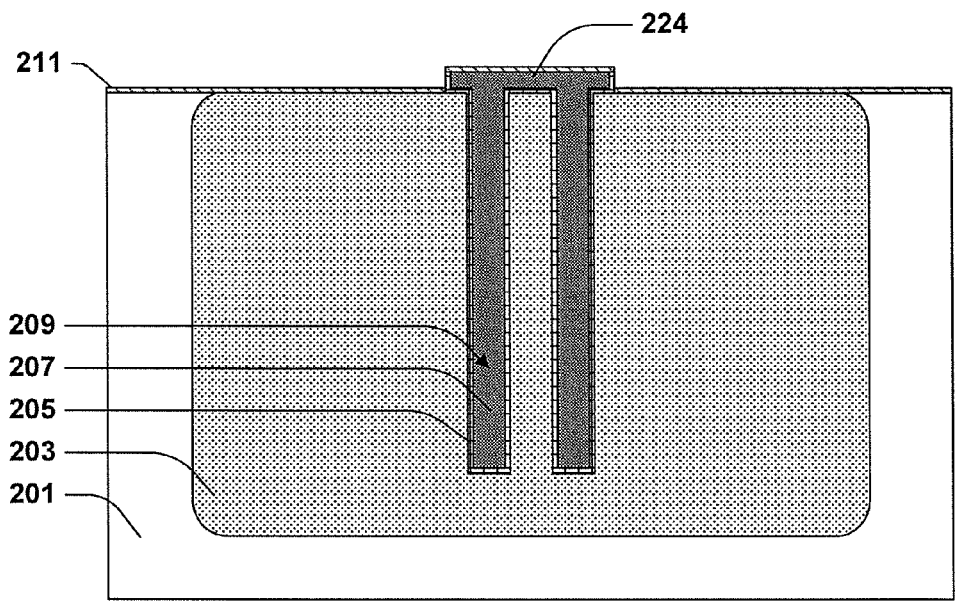
FIG. 13 illustrates the structure of FIG. 12 following formation of an oxide layer according to one or more embodiments.

Operation 125 is a surface oxidation process that forms a dielectric oxide layer over the contact plate 224 and exposed surfaces of the semiconductor 201. The resulting structure is illustrated by FIG. 13 according to one or more embodiments. An advantage of using polysilicon or like material in operation 119 is that it allows the dielectric layer 211 to be formed over contact plate 224 by operation 125. The dielectric layer 211 may have a thickness of between 5 nm and 10 nm in one embodiment.

Figure 14:
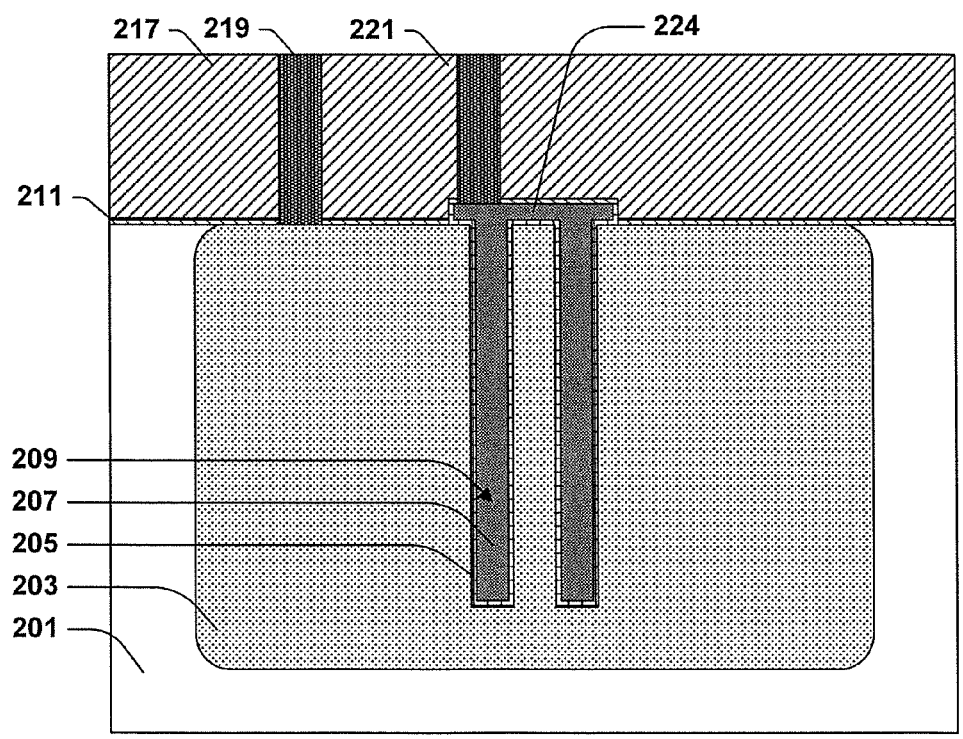
FIG. 14 illustrates the structure of FIG. 13 following formation of a contact layer according to one or more embodiments.

Operations 127 through 131 are some additional operations that can be used with process 100. Operation 127 forms an inter-level dielectric layer 217 over the substrate 200. Operation 129 etches contact vias through the inter-level dielectric layer 217 and dielectric oxide layer 211. Operation 131 fills the vias with metal to form contacts 219 and 221. The contact 219 forms an electrical connection with doped region 203. The contact 221 forms an electrical connection with contact plate 224. The resulting structure is illustrated by FIG. 14 according to one or more embodiments.

The present disclosure provides a manufacturing process in which a hard mask layer is formed and patterned on a surface of a semiconductor substrate. Two or more parallel trenches are etched in the semiconductor substrate using the patterned hard mask as an etch mask. An etch process is then used to partially remove the patterned hard mask from the substrate surface. The process removes the hard mask layer between adjacent trenches while thinning but not removing the hard mask layer at other locations on the substrate surface. Conductive material is then deposited. The conductive material fills the trenches, the substrate between the trenches, and overlays at least a portion of the remaining hard mask layer. Chemical mechanical polishing removes the conductive material from areas where it overlays the remaining hard mask layer, but leaves conductive material overlaying the trenches and the substrate between adjacent trenches. The conductive material provides a conductive pathway between adjacent trenches.

Another aspect of the present disclosure is a method of fabricating a semiconductor device that includes forming a mask over a semiconductor substrate. The substrate is etched where it is exposed through openings in the mask to form two or more trenches. The trenches are separated by a distance that is less than or equal to twice the mask thickness. The mask is then, reduced by an isotropic etch process and conductive material is deposited filling the trenches and openings in the mask. A planarization process removes the conductive material down to the mask layer, whereby conductive material remains in mask openings and forms a conductive bridge across the trenches.

Another aspect of the present disclosure is a method of fabricating a semiconductor device that includes providing a semiconductor substrate, forming a hard mask layer over a surface of the substrate, etching the hard mask layer to form a patterned hard mask having a first pattern having a first number of openings, and etching the semiconductor substrate using the patterned hard mask as an etch mask. The hard mask is then etched with an oxidizing solution, the etch process progressing to the extent of reducing the thickness of the hard mask and causing some of the openings to unite. The etch process leaves the hard mask having a second pattern and a second number of openings. Conductive material is then deposited, filling the hard mask openings. The substrate is then chemically mechanically polished using the hard mask as a stop layer. Polishing leaves the conductive material as an inlay within the mask layer.

These processes and methods allow one lithographic process to be used to define both a trench pattern and a pattern for a contact plate that overlays the trenches. Two masks are eliminated as compared to the prior art. In the prior art, the conductive material would be deposited over the substrate and a second mask used to reduce the conductive material to the contact plate pattern. The conductive material would cover alignment marks in the substrate. A third mask and etch would be required to expose the alignment marks before the second mask could be patterned. Moreover, in the present disclosure the conductive material can be reduced to the contact plate pattern by chemical mechanical polishing using a hard mask as a stop layer. This process is easier to control as compared to a masked etch process that would be used to pattern the conductive material in the prior art. The methods and processes of the present disclosure can provide reduced queue time, reduced complexity, and improved uniformity for the resulting structures.

Processes and methods provided by the present disclosure can be used to manufacture vertically structured devices such as deep trench capacitors. In particular, the processes and methods provide a streamlined approach to forming the capacitor trenches and an upper contact plate. A conductive well formed by diffusion doping of the substrate around the trenches can provide a second contact plate. The hard mask can be removed after planarizing and manufacturing completed using a previously established process flow.

The disclosure as delineated by the following claims has been shown and/or described in terms of certain concepts, components, and features. While a particular component or feature may have been disclosed herein with respect to only one of several concepts or examples or in both broad and narrow terms, the components or features in their broad or narrow conceptions may be combined with one or more other components or features in their broad or narrow conceptions wherein such a combination would be recognized as logical by one of ordinary skill in the art. Also, this one specification may describe more than one embodiment and the following claims do not necessarily encompass every concept, aspect, embodiment, or example described herein.

The invention claimed is:

1. A method of fabricating a semiconductor device, comprising:
   forming a mask over a semiconductor substrate, the mask comprising a layer of a material, wherein the layer has a thickness and openings;
   etching the semiconductor substrate where it is exposed through the openings of the layer to form two or more trenches in the semiconductor substrate, each trench corresponding to a different one of the openings;
   etching the layer isotropically, wherein etching extends the openings of the layer;
   forming a dielectric liner in the trenches;
   depositing conductive material to fill the trenches and the extended openings in the remaining mask after forming the dielectric liner; and
   planarizing the semiconductor substrate to remove the conductive material down to the mask;
   wherein conductive material remains in the openings of the layer; and
   the conductive material remaining in the openings of the layer forms a conductive bridge across the trenches.

2. The method of claim 1, wherein planarizing comprises chemical mechanical polishing using the layer as a stop layer.

3. The method of claim 1, further comprising removing the mask layer to leave the conductive material exposed and protruding at the substrate surface.

4. The method of claim 1, wherein a resultant structure comprises a deep trench capacitor.

5. The method of claim 1, wherein:
   the trenches being separated by a distance that is less than or equal to the mask thickness; and
   the trenches have a depth to width ratio of 10:1 or greater.

6. A manufacturing process, comprising:
   providing a semiconductor substrate;
   forming a hard mask layer over a surface of the substrate;
   patterning the hard mask layer to form a patterned hard mask;

etching two or more parallel trenches in the semiconductor substrate using the patterned hard mask as an etch mask;

etching that removes the patterned hard mask from over the substrate surface between two adjacent trenches while thinning but not removing the hard mask layer at other locations over the substrate surface;

forming a dielectric liner in the trenches;

depositing conductive material on the substrate after forming the dielectric liner, the conductive material filling and overlaying the trenches, the substrate between the trenches, and at least a portion of the remaining hard mask layer; and chemically mechanically polishing the substrate to remove the conductive material from above the remaining hard mask layer while leaving conductive material overlaying the trenches and overlaying the substrate between adjacent trenches, whereby the conductive material provides a conductive pathway between adjacent trenches.

7. The process of claim 6, wherein the remaining hard mask layer provides a stop layer for the chemically mechanically polishing.

8. The process of claim 6, wherein the etch that partially removes the patterned hard mask is a wet etch.

9. The process of claim 6, further comprising completing removal of the patterned hard mask from the substrate surface after chemical mechanical polishing.

10. The process of claim 6, further comprising:
after completing removal of the patterned hard mask from the substrate surface, forming a dielectric layer over the substrate and the conductive material by oxidizing the substrate and the conductive material;
wherein the substrate is a silicon substrate; and
the conductive material comprises polysilicon.

11. The process of claim 6, further comprising depositing one or more layers of dielectric that line the trenches before depositing the conductive material.

12. The process of claim 11, wherein the one or more layers of dielectric are deposited after etching to partially remove the patterned hard mask from the substrate surface.

13. The process of claim 6, wherein a resultant structure comprises a deep trench capacitor.

14. A method of fabricating a semiconductor device, comprising:
providing a semiconductor substrate;
forming a hard mask layer over a surface of the substrate;
etching the hard mask layer to form a patterned hard mask having a first pattern with a first number of openings;
etching the semiconductor substrate using the patterned hard mask as an etch mask to form a first number of trenches in the semiconductor substrate;
after forming the first number of trenches, etching the patterned hard mask with an acid solution, the etch process reducing the thickness of the hard mask layer, the acid solution causing the number of openings to reduce leaving the hard mask layer having a second pattern with a second number of openings, the second number being less than the first number;
forming a dielectric liner in the trenches;
depositing conductive material over the semiconductor substrate after forming the dielectric liner, the conductive material filling the openings in the hard mask layer having the second pattern; and
chemically mechanically polishing using the hard mask as a stop layer, whereby the conductive material forms inlays within the hard mask layer.

15. The method of claim 14, further comprising removing the mask layer to leave the conductive material exposed and protruding at the substrate surface in a pattern corresponding to the second pattern.

16. The method of claim 14, wherein a resultant structure comprises a deep trench capacitor.

17. The method of claim 14, wherein the hard mask layer is a single layer of one material.

18. The method of claim 17, wherein the openings are openings through an uppermost plane of the hard mask layer.

19. The method of claim 17, the isotropic etching of the single layer of the mask thins the single layer without completely removing the single layer.

* * * * *